United States Patent
Lam (10) Patent No.: US 11,600,523 B2
(45) Date of Patent: Mar. 7, 2023

(54) SEMICONDUCTOR PACKAGE HAVING EXPOSED REDISTRIBUTION LAYER FEATURES AND RELATED METHODS OF PACKAGING AND TESTING

(71) Applicant: Microchip Technology Incorporated, Chandler, AZ (US)

(72) Inventor: ManKit Lam, Colorado Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 1228 days.

(21) Appl. No.: 15/940,807

(22) Filed: Mar. 29, 2018

(65) Prior Publication Data

US 2018/0294186 A1    Oct. 11, 2018

Related U.S. Application Data

(60) Provisional application No. 62/483,253, filed on Apr. 7, 2017.

(51) Int. Cl.
*H01L 21/768* (2006.01)
*H01L 23/00* (2006.01)
(Continued)

(52) U.S. Cl.
CPC .... *H01L 21/76837* (2013.01); *G01R 31/2813* (2013.01); *H01L 22/14* (2013.01);
(Continued)

(58) Field of Classification Search
CPC ........ G01R 31/28–2818; G01R 31/2832–2853
See application file for complete search history.

(56) References Cited

U.S. PATENT DOCUMENTS

| | | | |
|---|---|---|---|
| 6,946,726 B1 * | 9/2005 | Kuang | H01L 23/055 257/695 |
| 2004/0049724 A1 * | 3/2004 | Bill | G11C 29/44 714/733 |

(Continued)

FOREIGN PATENT DOCUMENTS

| | | |
|---|---|---|
| CN | 103943526 A | 7/2014 |
| CN | 105655311 A | 6/2016 |

(Continued)

OTHER PUBLICATIONS

International Search Report from International Application No. PCT/US2018/024943 dated Jun. 18, 2018, 5 pages.

(Continued)

*Primary Examiner* — Huy Q Phan
*Assistant Examiner* — David B Frederiksen
(74) *Attorney, Agent, or Firm* — TraskBritt (57) ABSTRACT

A method of packaging a semiconductor device having a bond pad on a surface thereof includes forming a redistribution material electrically coupled to the bond pad, forming a dielectric material over the redistribution material, and removing a first portion of the dielectric material to expose a first portion of the redistribution material. Semiconductor packages may include a redistribution layer having a first portion adjacent and coupled to a first contact of the package, a second portion exposed by a first opening in a dielectric material, and a redistribution line electrically coupled to a first bond pad, the first portion, and the second portion. Such a package may be tested placing at least one probe needle in contact with at least one terminal of the package, providing a test signal from the probe needle to the package through the terminal, and detecting signals using the needle.

14 Claims, 10 Drawing Sheets

(51) Int. Cl.
  *G01R 31/28* (2006.01)
  *H01L 21/66* (2006.01)
  *H01L 23/31* (2006.01)
(52) U.S. Cl.
  CPC .............. *H01L 22/32* (2013.01); *H01L 24/02* (2013.01); *H01L 24/03* (2013.01); *H01L 24/05* (2013.01); *H01L 24/08* (2013.01); H01L 23/3114 (2013.01); H01L 23/3192 (2013.01); H01L 24/13 (2013.01); H01L 2224/024 (2013.01); H01L 2224/0231 (2013.01); H01L 2224/0239 (2013.01); H01L 2224/02331 (2013.01); H01L 2224/02375 (2013.01); H01L 2224/02379 (2013.01); H01L 2224/0345 (2013.01); H01L 2224/0346 (2013.01); H01L 2224/0392 (2013.01); H01L 2224/0401 (2013.01); H01L 2224/05008 (2013.01); H01L 2224/05022 (2013.01); H01L 2224/05024 (2013.01); H01L 2224/05082 (2013.01); H01L 2224/05147 (2013.01); H01L 2224/05166 (2013.01); H01L 2224/05548 (2013.01); H01L 2224/05572 (2013.01); H01L 2224/05613 (2013.01); H01L 2224/05624 (2013.01); H01L 2224/05647 (2013.01); H01L 2224/05655 (2013.01); H01L 2224/05657 (2013.01); H01L 2224/05666 (2013.01); H01L 2224/05671 (2013.01); H01L 2224/05684 (2013.01); H01L 2224/131 (2013.01); H01L 2224/13111 (2013.01); H01L 2224/13113 (2013.01); H01L 2224/13118 (2013.01); H01L 2224/13139 (2013.01); H01L 2224/13147 (2013.01); H01L 2224/13157 (2013.01)

(56) References Cited

U.S. PATENT DOCUMENTS

| | | | |
|---|---|---|---|
| 2005/0121804 A1 | 6/2005 | Kuo et al. | |
| 2005/0248011 A1* | 11/2005 | Jung | H01L 24/05 257/678 |
| 2008/0036081 A1* | 2/2008 | Jeong | H01L 24/03 257/737 |
| 2010/0007007 A1* | 1/2010 | Yoon | H01L 23/3171 257/788 |
| 2011/0297838 A1* | 12/2011 | Wangerin | G01T 1/2928 250/371 |
| 2015/0348923 A1* | 12/2015 | Wang | H01L 23/3114 257/774 |
| 2017/0011976 A1 | 1/2017 | Park et al. | |
| 2017/0154843 A1* | 6/2017 | Chen | H01L 25/0655 |

FOREIGN PATENT DOCUMENTS

EP  1176637 A1  1/2002
KR  2010-0006104 A  1/2010

OTHER PUBLICATIONS

International Written Opinion from International Application No. PCT/US2018/024943 dated Jun. 18, 2018, 8 pages.
Taiwanese Office Action from Taiwanese Application No. 107111507, dated Jan. 18, 2019, 12 pages with English translation.
TW Search report dated Sep. 19, 2018 for TW Application No. 107111507.
Chinese First Office Action for Chinese Application No. 201880022899.3, dated Nov. 3, 2022, 10 pages with translation.
German First Office Action for German Application No. 112018001888.1, dated Sep. 12, 2022, 20 pages with translation.

* cited by examiner

SEMICONDUCTOR PACKAGE HAVING EXPOSED REDISTRIBUTION LAYER FEATURES AND RELATED METHODS OF PACKAGING AND TESTING

TECHNICAL FIELD

This disclosure relates generally to semiconductor packages and methods of packaging and testing semiconductor packages. Some specifically disclosed embodiments relate to wafer-level-chip-scale-packages (WLCSP) having one or more exposed portions of the redistribution layer in the final package configuration and methods of packaging and testing such wafer-level-chip-scale-packages.

BACKGROUND

Electrical components and circuitry in semiconductor devices may be damaged or their characteristics altered during packaging processes, including high-temperature process steps. Techniques such as wafer probing may be utilized to test semiconductor devices and detect damage and/or changes to the characteristics of the electrical components and/or circuitry. If damage or changes are detected, mitigation steps are sometimes possible.

Figure 1A:
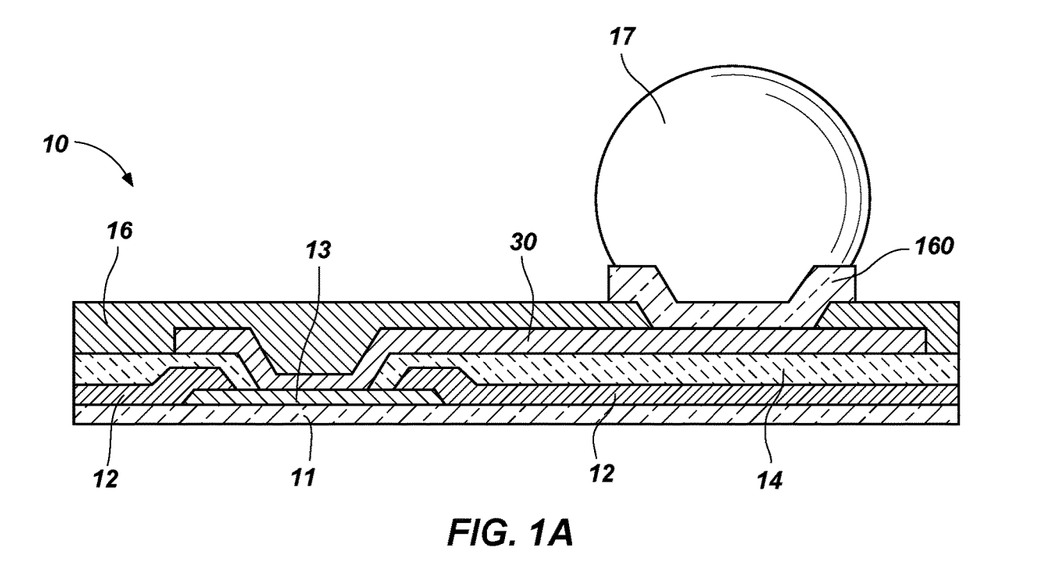
FIG. 1A is a schematic cross-sectional view of a portion of a semiconductor package with an encapsulated redistribution layer that represents the known state of the art.
Figure 1B:
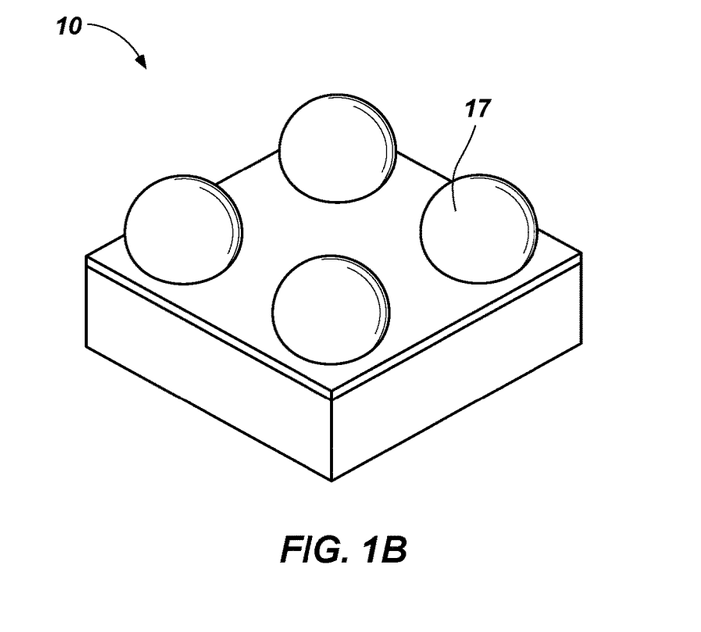
FIG. 1B is a schematic isometric-view of a semiconductor package with an encapsulated redistribution layer that represents the known start of the art.

FIGS. 1A and 1B represent the known state of the art. FIG. 1A is a cross-sectional view of a semiconductor package 10 with an encapsulated redistribution layer 30. The semiconductor package 10 includes a semiconductor device 11 having thereon a passivation layer 12 and at least one bond pad 13. The semiconductor package 10 also includes a dielectric layer 14, a redistribution layer 30, a dielectric layer 16, an adhesive layer 160 (e.g., a solderable adhesion metal layer), and package contacts 17. The redistribution layer 30 is externally accessible only by the package contact 17. By way of non-limiting example package contacts may be solder balls, solder bumps, copper pillar bumps, or combinations thereof.

FIG. 1B is a plan-view of the semiconductor package 10 illustrated in FIG. 1A. The redistribution layer 30 of the semiconductor package 10 is externally accessible only by the package contact 17.

There is a need for semiconductor packages and packaging techniques that facilitate, in a cost effective manner, testing and mitigation of defects. Other disadvantages and drawbacks may exist in the prior art.

DETAILED DESCRIPTION

The illustrations presented herein are not meant to be actual views of any particular act in a method of fabricating a semiconductor device, intermediate product of such a method, semiconductor device, or component thereof, but are merely idealized representations employed to describe illustrative embodiments of the present disclosure. Thus, the drawings are not necessarily to scale.

Disclosed embodiments relate generally to semiconductor packages and methods of packaging and testing semiconductor packages. Some specifically disclosed embodiments relate to semiconductor packages that may include one or more exposed portions of redistribution layers. The exposed portions of the redistribution layers may include one or more terminals that are electrically conductive and accessible for, among other things, electrical contact with probes of a testing device. As further described, below, with reference to FIGS. 5A through 5E and 9A through 9D, redistribution layers may include more than one terminal; indeed, redistribution regions of the one or more redistribution layers may each include one or more terminals.

Various embodiments of the disclosure relate to semiconductor devices that comprise electrical circuitry "embedded" or "integrated" in the silicon or semiconductor material of the device. Sometimes these are also referred to as semiconductor chips. Examples of electrical circuitry include, but are not limited to, an integrated circuit (IC), an application specific integrated circuit (ASIC), a microprocessor, a memory device, and combinations thereof.

A semiconductor device may be part of an "assembly" or "package" that protects the circuitry of the semiconductor device, dissipates heat, and holds the external electrical contacts (e.g., bumps, pins and/or leads) for electrically and physically coupling the semiconductor device with external circuitry.

Techniques for packaging include, but are not limited to, wire bonding, tape automatic bonding, and flip-chip. Among the packaging techniques is "chip-scale packaging," where the semiconductor package has the same or approximately the same form factor as the semiconductor device. Conventionally, chip-scale-packaging includes any packaging process that results in a ratio of packaging to die less than or equal to 1.2:1. When such semiconductor devices are packaged while they remain part of a larger wafer comprising a plurality of such devices, the packages are commonly referred to as wafer-level-chip-scale-packages (WLCSP).

Figure 2A:
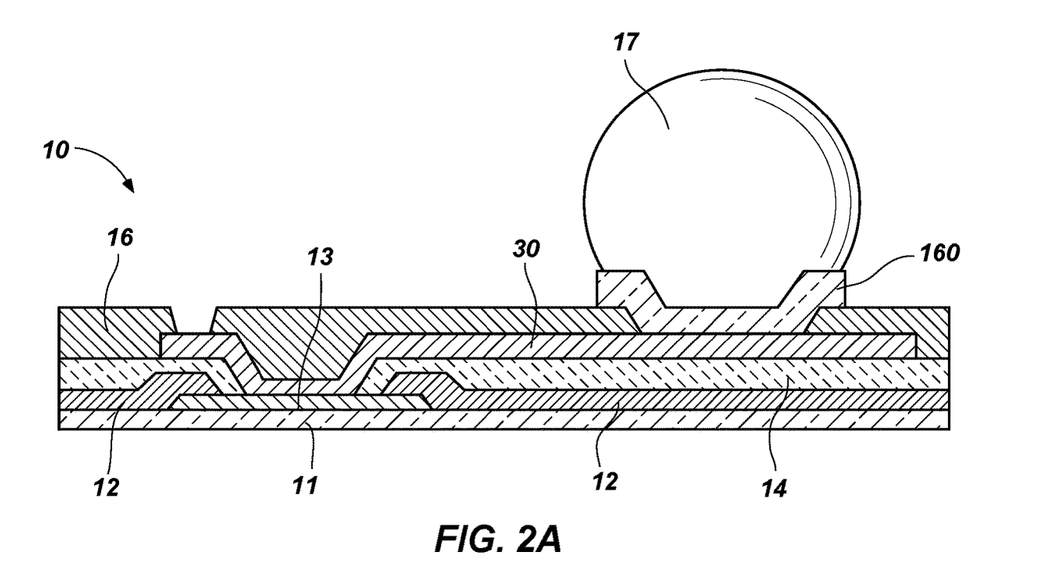
FIG. 2A is a schematic cross-sectional view of a portion of a semiconductor package having at least one exposed portion of a redistribution layer according to an embodiment of the disclosure.

FIG. 2A is a cross-sectional view of a semiconductor package 100 having at least one exposed redistribution layer 140 according to an embodiment of the disclosure. The semiconductor package 100 includes a semiconductor device 110, a dielectric layer 130, a redistribution layer 140, a dielectric layer 150, and an adhesive layer 160, and package contact 170. On the top surface of the semiconductor device 110 is formed at least one bond pad 120 and a passivation layer 114.

Figure 2B:
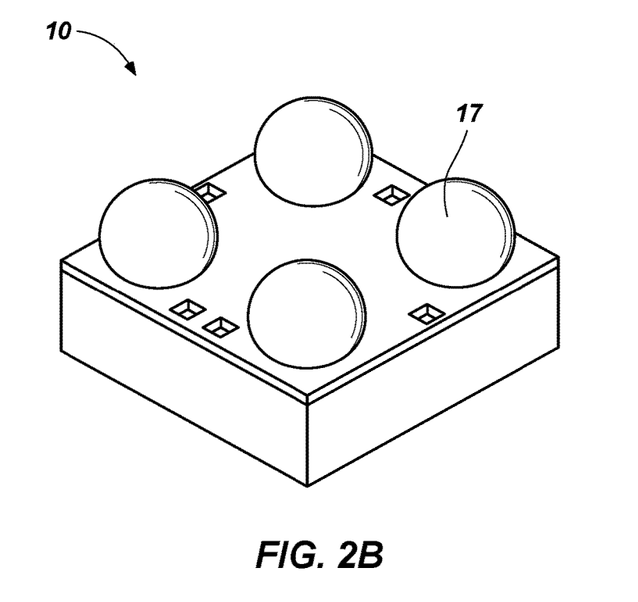
FIG. 2B is a schematic isometric-view of a semiconductor package having at least one exposed redistribution layer according to an embodiment of the disclosure.

FIG. 2B is an isometric-view of a semiconductor package 100 having at least one exposed portion of a redistribution layer 140 according to an embodiment of the disclosure. The exposed redistribution layer 140 comprises terminals 141 and 145 that are electrically conductive and accessible to probes of a testing device—as well as other terminals shown in FIG. 2B that are also electrically conductive and physically accessible but for simplicity of discussion are not specifically referenced.

Figure 3:
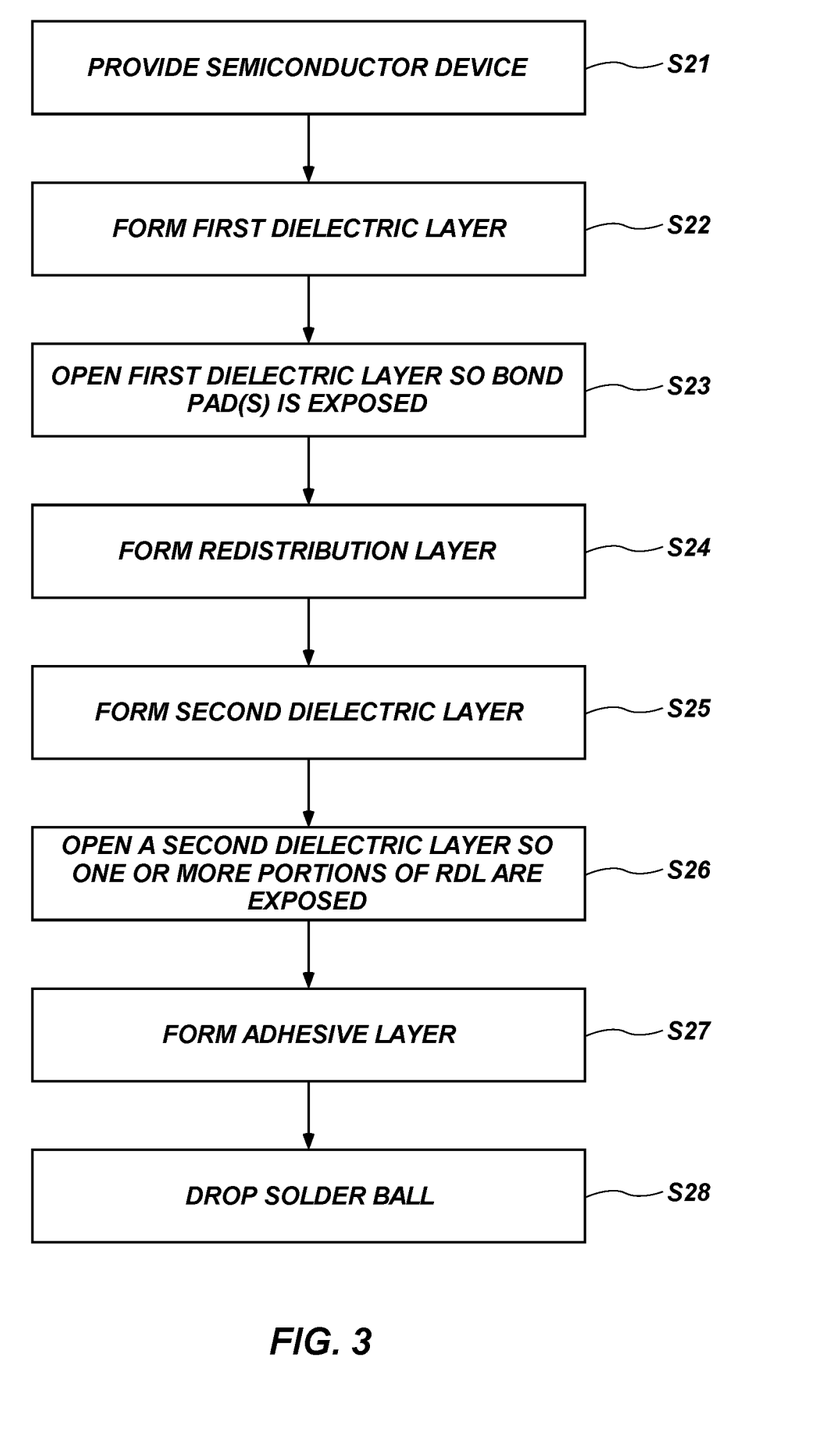
FIG. 3 is a flowchart of acts in a process according to embodiments of the disclosure for packaging a semiconductor device having at least one exposed portion of a redistribution layer according to an embodiment of the disclosure.

FIG. 3 is a flowchart of acts in a process according to embodiments of the disclosure for packaging a semiconductor device having at least one exposed redistribution layer according to an embodiment of the disclosure. The block of act S21 includes: provide semiconductor device. The block of act S22 includes: form first dielectric layer. The block of act S23 includes: open first dielectric layer so bond pad(s) is exposed. The block of act S24 includes: form redistribution layer. The block of act S25 includes: form second dielectric layer. The block of act S26 includes: open a second dielectric layer so one or more portions of RDL are exposed. The block of act S27 includes: form adhesive layer. The block of act S28 includes: drop solder ball.

FIGS. 4A through 4E illustrate cross sectional views of a packaging process for a semiconductor package 100 that exposes one or more portions of a redistribution layer 140 of the semiconductor package 100, according to an embodiment of the disclosure.

Figure 4A:
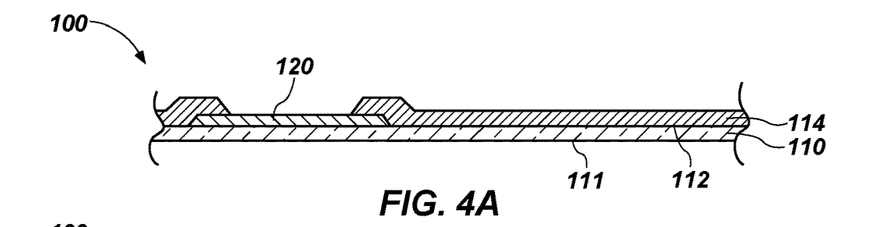
FIGS. 4A through 4E are schematic cross-sectional views of portions of a semiconductor device undergoing a packaging process that exposes at least one portion of a redistribution layer according to an embodiment of the disclosure.

Referring to FIG. 4A, a semiconductor die 110 having an approximately planar bottom surface 111 and an approximately planar top surface 112, opposite the bottom surface 111, is shown. The semiconductor die 110 has at least one bond pad 120 formed on the top surface 112. The semiconductor die 110 has a passivation layer 114 (e.g., a nitride such as silicon nitride) of a suitable thickness formed on the top surface 112 such that the bond pad 120 is open, i.e., so that the passivation layer 114 covers the top surface 112 but not some or all of the bond pad 120.

Figure 4B:
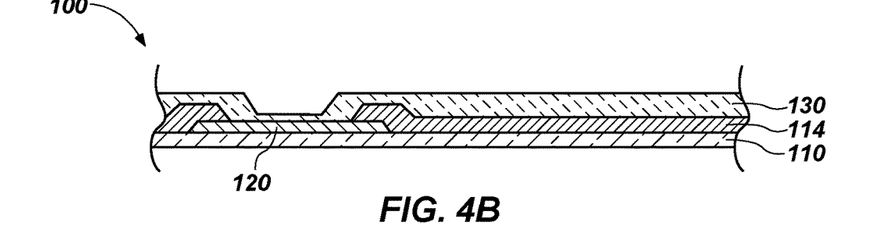

Referring to FIG. 4B, a first dielectric layer 130 of a suitable thickness is shown formed on the passivation layer 114. The first dielectric layer 130 may cover the entire passivation layer 114 and is formed with opening 131 such that the bond pad 120 is exposed. By way of non-limiting example, a suitable thickness of the first dielectric layer 130 may vary between 3 μm and 20 μm, inclusive.

In one embodiment, opening 131 is formed by a photolithographic process comprising applying a photoresist material to the dielectric layer 130, masking the photoresist layer according to a predetermined pattern, exposing the masked photoresist layer, developing the photoresist layer and etching a portion of the first dielectric layer 130 to form the opening 131 and expose the bond pad 120, stripping any remaining photoresist material, and curing the dielectric material. Those of ordinary skill in the art will understand that variations in the photolithographic process exist or are possible and may be used.

By way of non-limiting example, the dielectric material may be a polyimide, Benzocyclobutane, Polybenzoxazole, Bismaleimidetriazine, Phenolic resin, epoxy, silicone, an oxide layer, a nitride layer, and similar materials. In one embodiment, curing of a polyimide dielectric material is performed over one or more cure phases at 100 to 400 degrees Celsius, inclusive, for up to 90 minutes until desired hardness is achieved. Curing conditions may be selected depending on the material selected for use as the dielectric material.

In another embodiment, the dielectric material of the first dielectric layer 130 is composed of a photodefinable polymer, for example, a positive acting polyimide, a negative tone polyimide, or a negative acting polyimide. The opening 131 is formed by coating a photodefinable polymer onto the passivation layer 114 by spin coating, a coat roller or similar process, semi-curing the material, masking the semi-cured dielectric layer 130, exposing the masked first dielectric layer 130, developing the first dielectric layer 130 to form the opening 131 and expose the bond pad 120, and finally curing the photodefinable polymer to form the first dielectric layer 130.

Figure 4C:
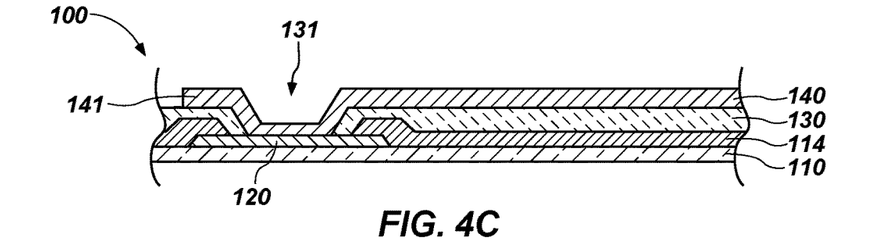

Referring to FIG. 4C, a redistribution layer 140 of a suitable thickness is shown formed on the first dielectric layer 130. By way of non-limiting example, a suitable thickness of the redistribution layer 140 may vary between 1 μm and 20 μm, inclusive.

In one embodiment, the redistribution layer 140 may be formed by a sputtering deposition process on the first dielectric layer 130 and the exposed bond pad 120. In other embodiments, other deposition processes may be utilized, for example, sputtering followed by plating. A region of the redistribution layer 140 is formed to have a pre-defined length (cross-sectional view) and area (plan-view). A portion of the redistribution layer is positioned adjacent (e.g., under) the package contact 170 to electrically and physically couple the bond pad 120 to the package contact 170. The redistribution layer 140 is further formed to include a terminal 141. In this embodiment the terminal 141 is relocated remotely from, and electrically coupled to, the bond pad 120 and the package contact 170; however, as will be explained in more detail with reference to FIGS. 5A through 5D, the location of the terminal 141 is a design consideration. By way of non-limiting example, terminals may be organized around the perimeter of a surface of a semiconductor package, grouped together in the center of a surface of a semiconductor package, on the side walls of a semiconductor package, in a diagonal, circle, etc.

In one embodiment, the redistribution layer 140 comprises a sputtered titanium adhesion layer, a sputtered copper conductive layer, and plated-up copper. The redistribution layer 140 may be made of other materials that are suitably conductive and suitably adherent to the polymers of the first dielectric layer 130 and dielectric layer 150 (see FIG. 2A). By way of non-limiting example, the redistribution layer 140 may comprise one or more layers or alloys of any one of titanium, chromium, aluminum, copper, nickel, tungsten, cobalt, and combinations thereof.

Figure 4D:
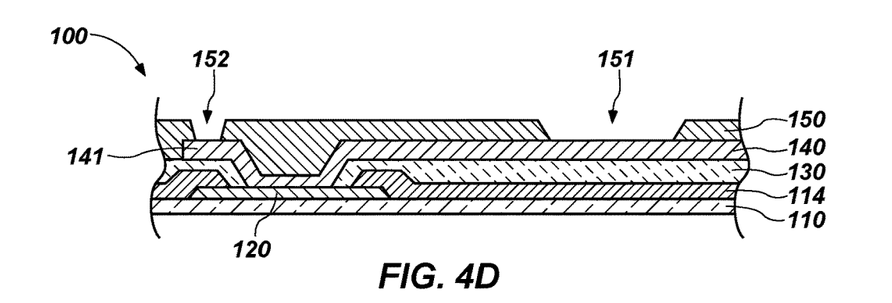

Referring to FIG. 4D, a second dielectric layer 150 of a suitable thickness is shown formed on the redistribution layer 140 and the first dielectric layer 130. By way of non-limiting example, a suitable thickness of the second dielectric layer 150 may vary between 3 µm and 20 µm, inclusive.

The second dielectric layer 150 is formed with opening 151 such that at least a portion of the redistribution layer 140 is exposed in the region where the package contact will be positioned, and opening 152, in the region above the terminal 141. In one embodiment, openings 151 and 152 are formed by one of substantially the same processes described herein to form the opening 131 in dielectric layer 130 (see FIG. 4B).

By way of non-limiting example, the dielectric material of the second dielectric layer 150 may be a polyimide, benzocyclobutane, polybenzoxazole, bismaleimidetriazine, phenolicresin, epoxy, silicone, an oxide layer, a nitride layer, and similar materials. By way of further non-limiting example, the dielectric material of the second dielectric layer 150 may also be a photo definable polymer.

Figure 4E:
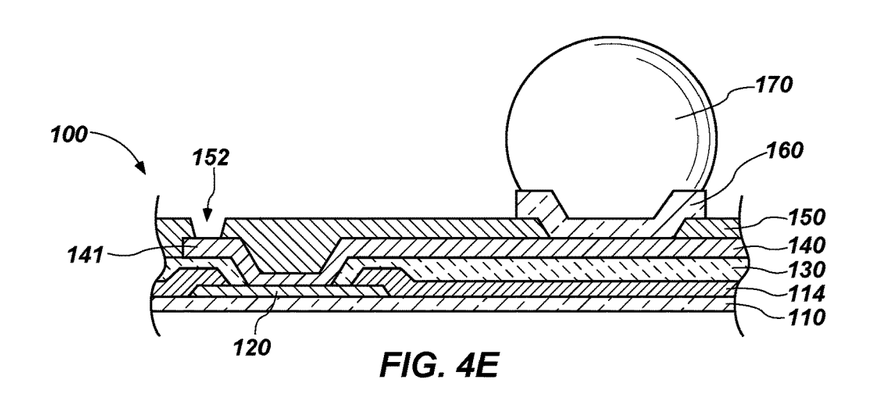

Referring to FIG. 4E, an adhesive layer 160 and package contact 170 (in this embodiment a solder ball) are shown formed across the opening 151 and on, and in electrically conductive coupling with, the redistribution layer 140. By way of non-limiting example, a suitable thickness of the adhesive layer 160 may vary between 1 µm and 20 µm, inclusive.

The adhesive layer 160 may partially cover the second dielectric layer 150. In one embodiment, the adhesive layer 160 may be may be a formed by a sputtering deposition process through the opening 151 onto the redistribution layer 140. In other embodiments, other deposition processes may be utilized, for example, evaporation, sputtering followed by plating or evaporation followed by plating. In one embodiment, the adhesive layer 160 is a solderable adhesion metal layer and comprises a sputtered titanium adhesion layer, a sputtered copper conductive layer, and plated-up copper.

The adhesive layer 160 may be made of other materials that are suitably electrically conductive and suitably adherent to the redistribution layer 140 and the package contact 170, and that allow the package contact 170 to suitably reflow. By way of non-limiting example, the adhesive layer 160 may comprise one or more layers or alloys of any one of titanium, chromium, aluminum, copper, nickel, tungsten, cobalt, and combinations thereof. In one embodiment the adhesive layer 160 is an under-bump metallization (UBM) layer or stack of layers.

The package contact 170 is formed on the adhesive layer 160 and adheres thereto. In one embodiment the package contact 170 may be a lead-free-alloy solder ball comprising, by way of non-limiting example, tin, alloys of tin, silver, copper, cobalt, bismuth zinc, and any combinations thereof.

Although an adhesive layer 160 is illustrated and described in connection with the embodiments illustrated in FIG. 4E, it is specifically contemplated that in another embodiment the adhesive layer 160 is partially or completely omitted from the structure. In such an embodiment, the package contact 170 (e.g., a solder ball) is formed on one or more portions of the redistribution layer 140 and is electrically and physically coupled to the redistribution layer 140.

Referring still to FIG. 4E, the semiconductor package 100 includes the opening 152 above the terminal 141. The opening 152 and terminal 141 provide electrically conductive access to the bond pad 120, and enable testing and reprogramming of the semiconductor electronics in the semiconductor device 110, including an integrated circuit at the wafer-level of a WLSCP.

The high temperatures used to cure the polymers of dielectric layer 130 and dielectric layer 150 may cause the semiconductor package 100 to operate outside of specification. In the particular case of a WLSCP, the high temperatures may cause charge losses in the integrated circuit that result in the programming margin shifting out of specification. Testing and remediation may be performed at various steps in the packaging process. It is preferable to perform testing and remediation after all high-temperature processing steps in the packaging process, for example, after curing the dielectric layers. Testing a WLCSP of the type of semiconductor package illustrated in FIGS. 1A and 1B is challenging and expensive. Certain bond pads on the semiconductor device are specifically for testing, and those tests must be run before packaging layers render them inaccessible. However, reconditioning the programming margin shift of the underlying circuitry should be performed after all high temperature process steps that might affect charge characteristics.

As will be described with reference to FIGS. 5A through 5E, testing and reprogramming the semiconductor package 100 illustrated in FIGS. 2A and 2B is facilitated by the openings 151, which permit electrically conductive access to the test bond pads (for testing the circuitry) and to the functional bond pads (for interacting with and reprograming the circuitry).

FIGS. 5A through 5E illustrate a plan view of the packaging process shown in FIGS. 4A through 4E of the semiconductor package 100, which exposes at least one portion of the redistribution layer 140 of the semiconductor package 100, according to an embodiment of the disclosure.

Figure 5A:
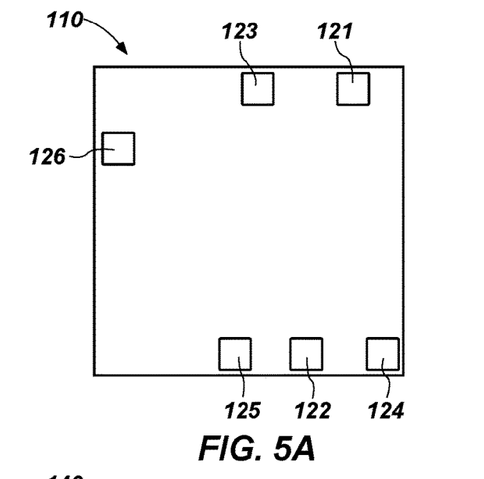
FIGS. 5A through 5E are schematic plan views of a semiconductor device undergoing a packaging process that exposes at least one portion of a redistribution layer according to an embodiment of the disclosure.

Referring to FIG. 5A, a plan-view of the semiconductor die 110 and the top surface 112 is shown. Also shown are the bond pads 120, which in this embodiment comprise test bond pads 121 and 122, and functional bond pads 123, 124, 125 and 126. The location and number of bond pads 120 is a design consideration that may vary based on the size of the semiconductor die, the electronics in the die, the standard to which the ultimate semiconductor package will comply, the form, fit, function requirements of the ultimate semiconductor package, and combinations thereof.

Figure 5B:
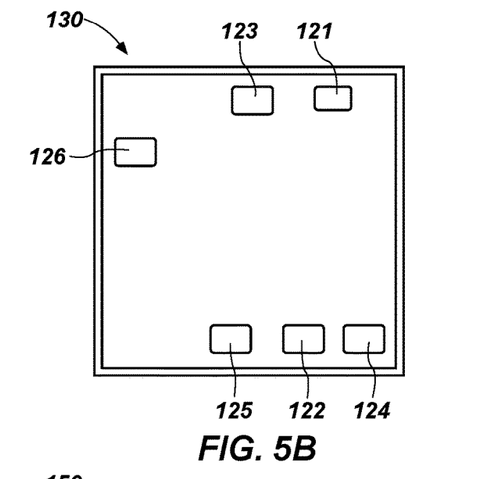

Referring to FIG. 5B, a plan-view of the partially assembled semiconductor package 100 is shown, according to an embodiment of the disclosure, and more particularly, the dielectric layer 130 and the bond pads 120. Each of the test bond pads 121 and 122, and functional bond pads, 123, 124, 125, and 126 is exposed due to the openings formed in the dielectric layer 130. In this embodiment, all of the bond pads 120 on the semiconductor die 110 are exposed after forming the dielectric layer 130, however, in other embodiments it is specifically contemplated that some bond pads 120 may be covered by the dielectric layer 130. By way of non-limiting example, bond pads 120 that are extraneous to testing or functional operation of the semiconductor package 100 may be covered by the dielectric layer 130.

Figure 5C:
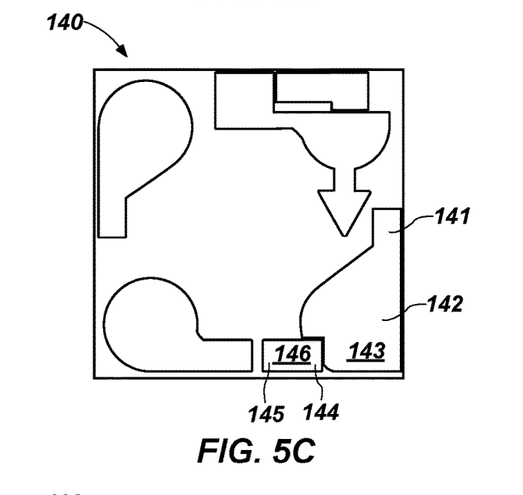

Referring to FIG. 5C, a plan view of the partially assembled semiconductor package 100 is shown, according to an embodiment of the disclosure, and more particularly, the redistribution layer 140. In this embodiment, the redistribution layer 140 comprises six electrically conductive redistribution regions, though to simplify this discussion only redistribution regions 143 and 146 are referenced in FIG. 5C. Redistribution region 143 comprises a redistribution line 142 and a terminal 141. The redistribution line 142 electrically and physically couples the functional bond pad 124 to the region where an external package contact will be positioned (See FIG. 2A) as well as to the terminal 141. Redistribution region 146 comprises a redistribution line 142 and a terminal 145. The redistribution line 142 electrically and physically couples the test bond pad 121 to the terminal 145.

Figure 5D:
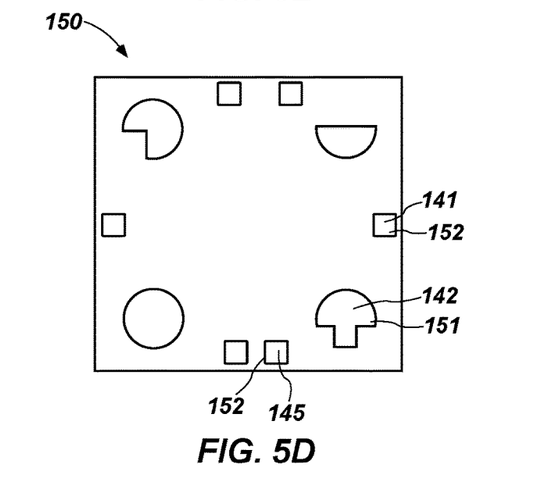

Referring to FIG. 5D, a plan-view of the partially assembled semiconductor package 100 is shown, according to an embodiment of the disclosure, and more particularly, the dielectric layer 150, and rerouted test bond pads and rerouted functional bond pads. For the rerouted bond pads of redistribution regions 143 and 146 (and similarly for the other redistribution regions), terminals 141 and 145 are exposed, respectively due to the openings 151 formed in the dielectric layer 150. The portion of redistribution line 142 at which package contact 170 (see FIG. 2A) will be positioned is also exposed due to the openings 152 formed in the dielectric layer 150.

Figure 5E:
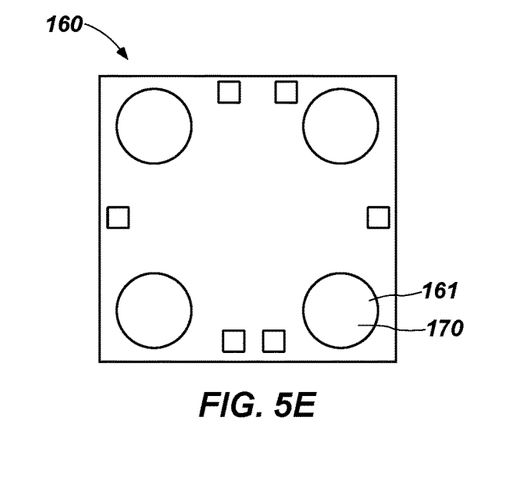

Referring to FIG. 5E, a plan-view of the partially assembled semiconductor package 100 is shown, according to an embodiment of the disclosure, and more particularly, the adhesive layer 160. Shown are four UBMs with package contacts, though only UBM 161 is referenced with package contact 170 positioned there on. The terminals of the rerouted bond pads 120 are exposed, and the terminals and the bond pads 120 are electrically and physically accessible independent of the package contacts.

In the embodiment shown in FIG. 5E the surfaces of terminals 141 and 145 are physically and electrically exposed, however, in alternative embodiments the terminals 141 and 145 may be coated with another material that is suitably electrically conductive. Such a material may protect the terminals 141 and 145 from contaminants during package and other processes. In one embodiment, the process for applying the adhesive layer 160 may include to the terminals of the redistribution regions.

In another embodiment, a metal-fill may be deposited on the exposed terminals up in the gap formed by the openings 151 of the dielectric layer 150. A predetermined amount of the metal-fill may be deposited, or metal-fill may be deposited up to a certain level below or above the top surface of the dielectric layer 150. In one embodiment the top surface of the metal-fill is approximately flush with the top surface of the dielectric layer 150.

Figure 6:
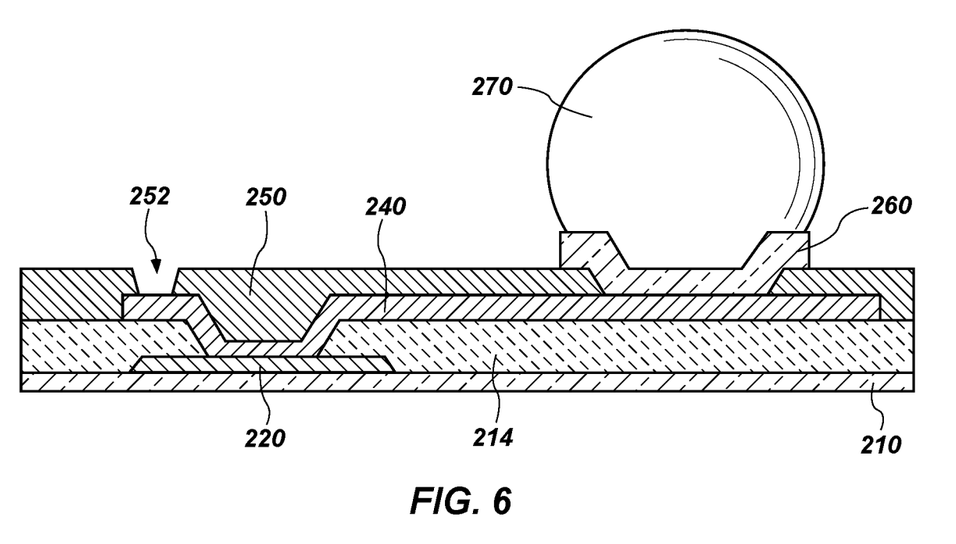
FIG. 6 is a schematic cross-sectional view of a portion of a semiconductor package having at least one exposed portion of a redistribution layer according to an embodiment of the disclosure.

FIG. 6 illustrates a cross-sectional view of a semiconductor package 200, according to an embodiment of the disclosure, where the redistribution layer 240 is formed on the passivation layer 214, without a dielectric layer there between.

Figure 7:
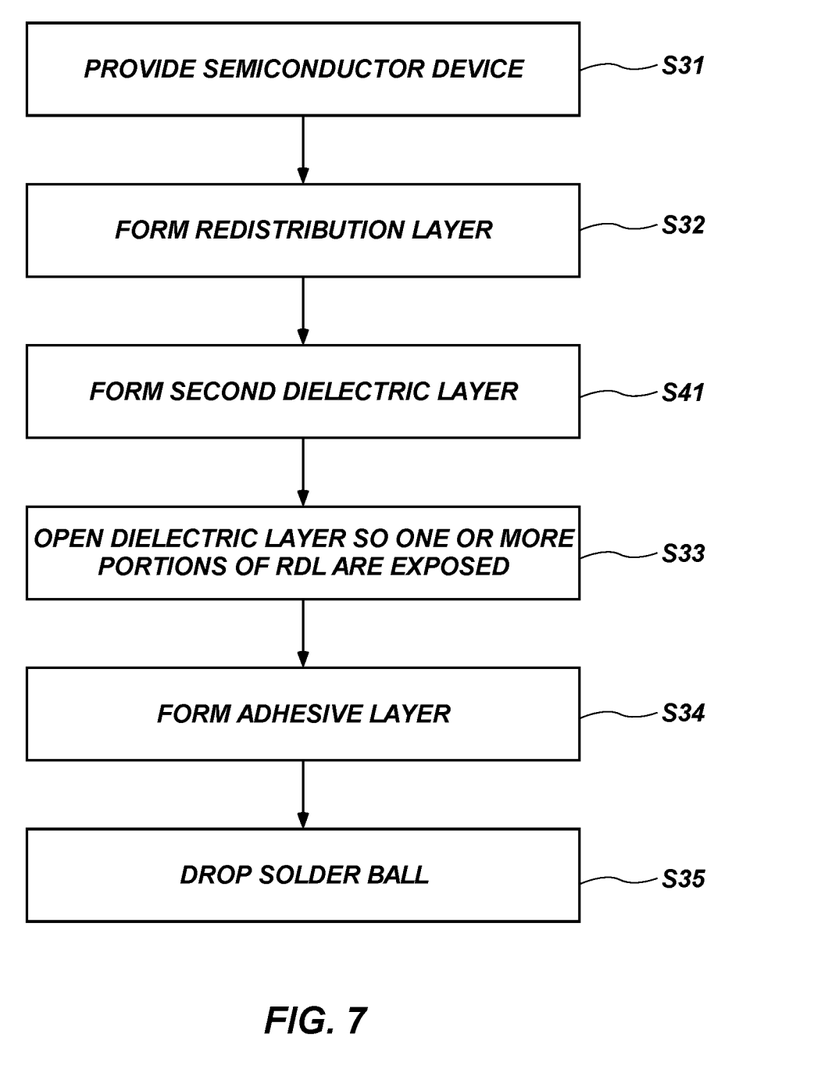
FIG. 7 is a flow chart of acts in a process according to embodiments of the disclosure for packaging a semiconductor device having at least one exposed portion of a redistribution layer.

FIG. 7 illustrates flow chart of acts in a process according to embodiments of the disclosure for packaging a semiconductor package 200 having at least one exposed redistribution layer. The block of act S31 includes: provide semiconductor device. The block of act S32 includes: form redistribution layer. The block of act S41 includes: form second dielectric layer. The block of act S33 includes: open dielectric layer so one or more portions of RDL are exposed. The block of S34 includes: form adhesive layer. The block of act S35 includes: drop solder ball.

FIGS. 8A through 8D illustrate cross-sectional views of a process for packaging a semiconductor package 200 that exposes at least one redistribution layer 240 of the semiconductor package 200, according to another embodiment of the disclosure.

Figure 8A:
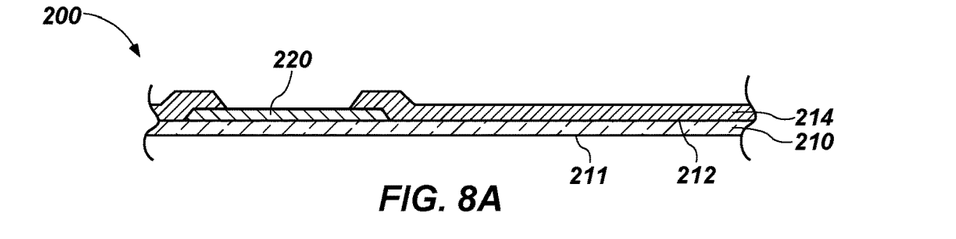
FIGS. 8A through 8D are schematic cross-sectional views of a portion of a semiconductor device undergoing a packaging process that exposes at least one portion of a redistribution layer according to an embodiment of the disclosure.

Referring to FIG. 8A, a semiconductor die 210 having an approximately planar bottom surface 211 and an approximately planar top surface 212, oppose the bottom surface 211, is shown. The semiconductor die 210 has at least one bond pad 220 formed on the top surface 212. The semiconductor die 210 has a passivation layer 214 (e.g., nitride or silicon nitride) of a suitable thickness formed on the top surface 212 such that the bond pad 220 is open, i.e., so that the passivation layer 214 covers the top surface 212 but not some or all of the bond pad 220.

Figure 8B:
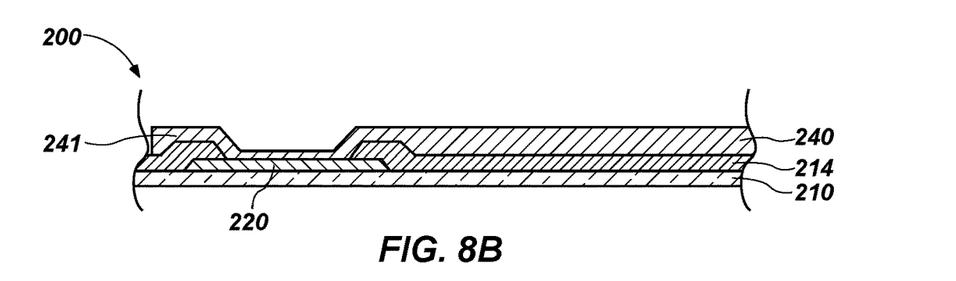

Referring to FIG. 8B, a redistribution layer 240 of a suitable thickness is shown formed on the passivation layer 214. By way of non-limiting example, a suitable thickness of the redistribution layer 140 may vary between 1 µm and 20 µm, inclusive.

In one embodiment, the redistribution layer 240 may be formed by a sputtering deposition process on the passivation layer 214 and the exposed bond pad 220. In other embodiments, other deposition processes may be utilized, for example, sputtering followed by plating. A region of the redistribution layer 240 is formed to have a pre-defined length (cross-sectional view) and area (plan-view). A portion of the redistribution layer 240 is positioned adjacent to the package contact 270 to electrically and physically couple the bond pad 220 directly to the package contact 270. The redistribution layer 240 is further formed to include a terminal 241. In this embodiment the terminal 241 is relocated remote from, and electrically coupled to, the bond pad 220 and the package contact 270; however, as will be explained in more detail with reference to FIGS. 9A through 9D, the location of the terminal 241 is a design consideration. By way of non-limiting example, terminals may be organized around the perimeter of a surface of a semiconductor package, grouped together in the center of a surface of a semiconductor package, on the side walls of a semiconductor package, in a diagonal, a circle, etc.

In one embodiment, the redistribution layer 240 comprises a sputtered titanium adhesion layer, a sputtered copper conductive layer, and plated-up copper. The redistribution layer 240 may be made of other materials that are suitably conductive and suitably adherent to the polymers of the dielectric layer 250 (see FIG. 6) and the passivation layer 214. By way of non-limiting example, the redistribution layer 240 may comprise one or more layers or alloys of any one of titanium, chromium, aluminum, copper, nickel, tungsten, cobalt, and combinations thereof.

Figure 8C:
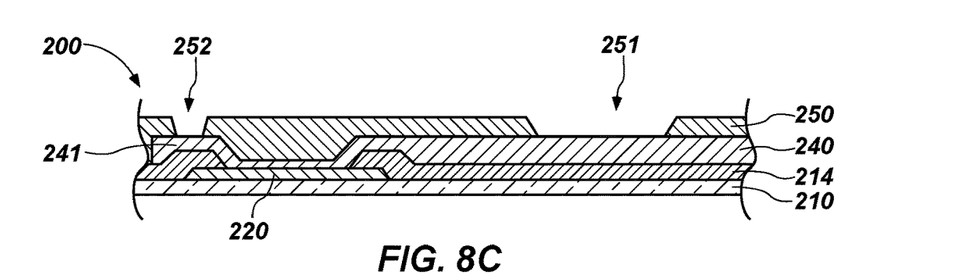

Referring to FIG. 8C, a dielectric layer 250 of a suitable thickness is shown formed on the redistribution layer 240 and the passivation layer 214. By way of non-limiting example, a suitable thickness of the dielectric layer 250 may vary between 1 µm and 20 µm, inclusive.

The dielectric layer 250 is formed with opening 251 such that at least a portion of the redistribution layer 240 is exposed in the region where the package contact will be positioned, and opening 252 to expose terminal 241.

In various embodiments, openings 251 and 252 are formed by a photolithographic process comprising applying a photoresist material to the dielectric layer 250, masking the photoresist layer according to a predetermined pattern, exposing the masked photoresist layer, developing the photoresist layer and etching portions of the dielectric layer 250 to form the openings 251 and 252 and expose terminal 241 and the portion of the redistribution layer 240 where the package contact will be positioned, stripping any remaining photoresist material, and curing the dielectric material. Those of ordinary skill in the art will understand that variations in the photolithographic process exist or are possible and may be used.

By way of non-limiting example, the dielectric material may be a polyimide, Benzocyclobutane, Polybenzoxazole, Bismaleimidetriazine, Phenolic resin, epoxy, silicone, an oxide layer, a nitride layer, and similar materials. In one embodiment, curing is performed over one or more cure phases at 100 to 400 degrees Celsius, inclusive, for up to 90 minutes until desired hardness is achieved.

In another embodiment, the dielectric material of the dielectric layer 250 is composed of a photodefinable polymer, for example, a positive acting polyimide, a negative tone polyimide, or a negative acting polyimide. The openings 251 and 252 are formed by coating a photodefinable polyimide onto the redistribution layer 240 by spin coating, a coat roller or similar process, semi-curing the material, masking the dielectric layer 250, exposing the masked dielectric layer 250, developing the dielectric layer 250 to form the opening 251 and 252 and expose the terminal 241 and the portion of the redistribution layer 240 adjacent to which the package contact will be positioned, and finally curing the photodefinable polyimide to form the dielectric layer 250.

Figure 8D:
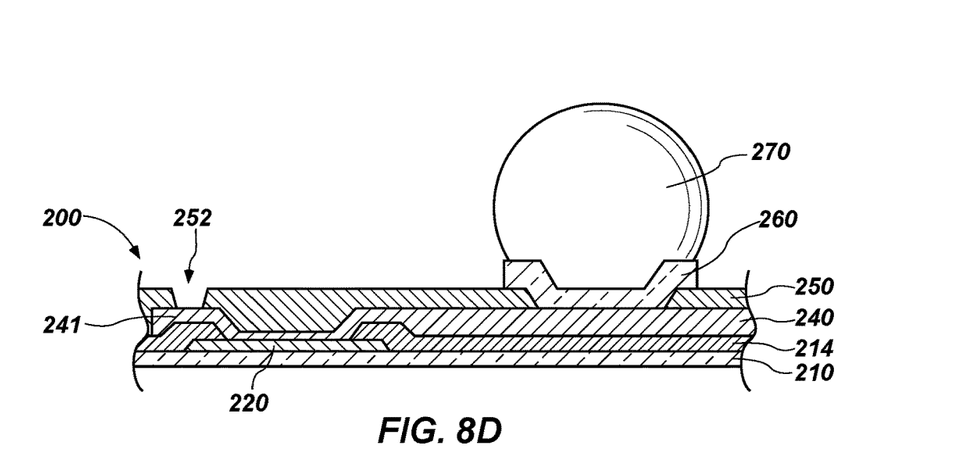

Referring to FIG. 8D, an adhesive layer 260 and package contact 270 are shown formed across the opening 251 and electrically and physically coupled to the redistribution layer 240. By way of non-limiting example, a suitable thickness of the adhesive layer 260 may vary between 1 µm and 20 µm, inclusive.

The adhesive layer 260 may partially cover the dielectric layer 250. In one embodiment, the adhesive layer 260 may be may be formed by a sputtering deposition process through the opening 251 onto the redistribution layer 240. In other embodiments, other deposition processes may be utilized, for example, evaporation, sputtering followed by plating or evaporation followed by plating. In one embodiment, the adhesive layer 260 is a solderable adhesion metal layer and comprises a sputtered titanium adhesion layer, a sputtered copper conductive layer, and plated-up copper.

The adhesive layer 260 may be made of other materials that are suitably electrically conductive and suitably adherent to the redistribution layer 240 and the package contact 270, and that allow the package contact 270 to suitably reflow. By way of non-limiting example, the adhesive layer 260 may comprise one or more layers or alloys of any one of titanium, chromium, aluminum, copper, nickel, tungsten, cobalt, and combinations thereof. In one embodiment the solderable adhesive metal layer 260 is an under-bump metallization (UBM) layer or stack of layers.

The package contact 270 is formed on the adhesive layer 260 and adheres thereto. In one embodiment the package contact 270 may be a lead-free alloy solder ball comprising, by way of non-limiting example, tin, alloys of tin, silver, copper, cobalt, bismuth zinc, and any combinations thereof.

Although an adhesive layer 260 is illustrated and described in connection with the embodiments illustrated in FIG. 8E, it is specifically contemplated that in another embodiment the adhesive layer 260 is partially or completely omitted from the structure. In such an embodiment, the package contact 270 is formed on one or more portions of the redistribution layer 240 and is electrically and physically coupled to the redistribution layer 140.

Referring still to FIG. 8D, the semiconductor package 200 includes the opening 252 above the terminal 241. The opening 252 and terminal 241 provide eclectically conductive access to the bond pad 220, and enable testing and reprogramming of the semiconductor electronics in the semiconductor die 210, including an integrated circuit at the wafer-level of a WLSCP.

As will be become clear with reference to FIGS. 9A through 9D, testing and reprogramming the semiconductor package 200 illustrated in FIG. 6 is facilitated by the openings 251 that enable electrically conductive access to the test bond pads (e.g., to test the circuitry) and to the functional bond pads (e.g., to interact with and reprogram the circuitry).

FIGS. 9A through 9E illustrate a plan view of the packaging process shown in FIGS. 8A through 8E of the semiconductor package 200, which exposes at least one portion of the redistribution layer 240 of the semiconductor package 200, according to an embodiment of the disclosure.

Figure 9A:
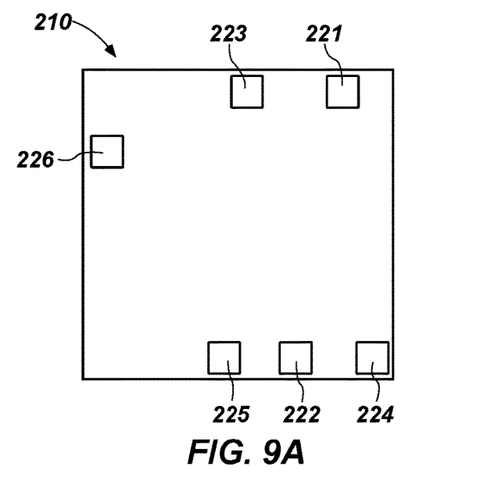
FIGS. 9A through 9D are schematic plan views of a semiconductor device undergoing a packaging process that exposes at least one portion of a redistribution layer according to an embodiment of the disclosure.

Referring to FIG. 9A, a plan-view of the semiconductor die 210 and the top surface 212 is shown. Also shown are the bond pads 220, which in this embodiment comprises test bond pads 221 and 222, and functional bond pads 223, 224, 225 and 226. The location and number of bond pads 220 is a design consideration that may vary based on the size of the semiconductor die, the electronics in the die, the standard to which the ultimate semiconductor package will comply, the form, fit, function requirements of the ultimate semiconductor package, and combinations thereof.

Figure 9B:
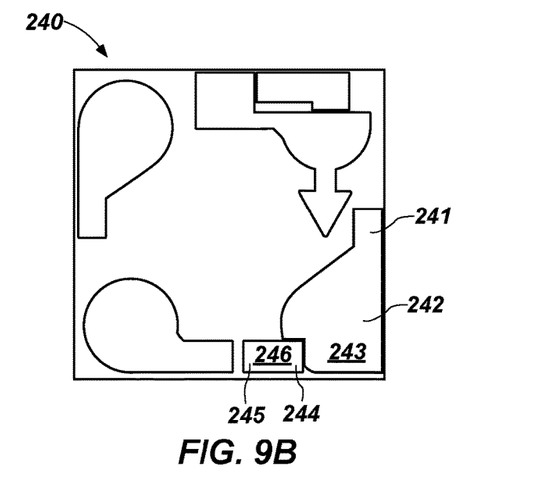

Referring to FIG. 9B, a plan-view of the partially assembled semiconductor package 200 is shown, according to an embodiment of the disclosure, and more particularly, the redistribution layer 240. In this embodiment, the redistribution layer 240 comprises six redistribution regions, though to simplify this discussion only redistribution regions 243 and 246 are referenced in FIG. 9C. Redistribution region 243 comprises a redistribution line 242 and a terminal 241. The redistribution line 242 electrically and physically couples the functional bond pad 224 to the portion of the redistribution region adjacent to which a package contact will be positioned (see FIG. 6) as well as to the terminal 241. Redistribution region 246 comprises a redistribution line 244 and a terminal 245. The redistribution line 244 electrically and physically couples the test bond pad 221 to the terminal 245.

Figure 9C:
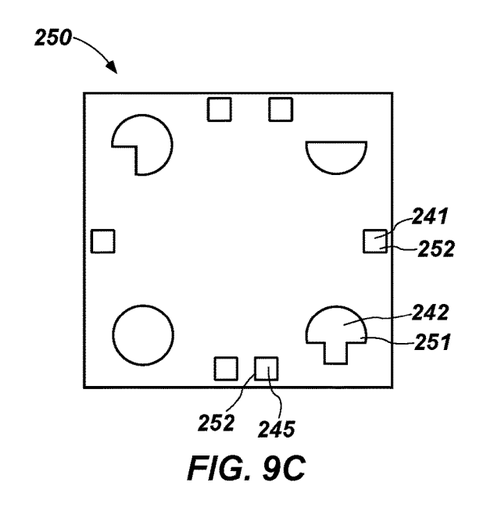

Referring to FIG. 9C, a plan-view of the partially assembled semiconductor package 200 is shown, according to an embodiment of the disclosure, and more particularly, the dielectric layer 250, and rerouted test bond pads and rerouted functional bond pads. For the rerouted bond pads of redistribution regions 243 and 246 (and similarly for the other redistribution regions), terminals 241 and 245 are exposed, respectively due to the openings 251 formed in the dielectric layer 250. The portion of redistribution line 242 upon which package contact 270 (see FIG. 6) will adhere is also exposed by the openings 252 formed in the dielectric layer 250.

Figure 9D:
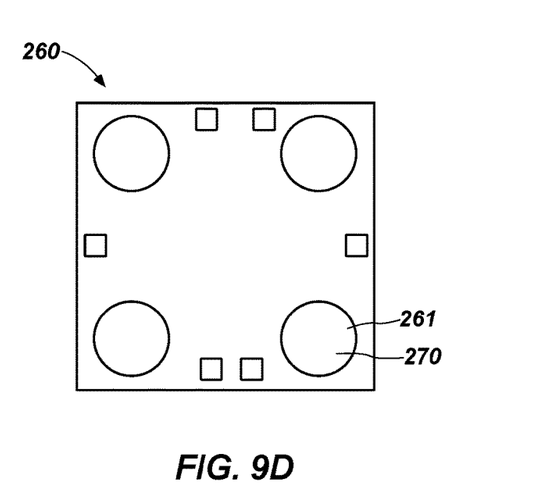

Referring to FIG. 9D, a plan-view of the partially assembled semiconductor package 200 is shown, according to an embodiment of the disclosure, and more particularly, the adhesive layer 260. Shown are four UBMs with package contacts, though only UBM 261 is referenced, with package contact 270 positioned there on. The terminals of the rerouted bond pads 220 are exposed, and the terminals and the bond pads 220 are electrically and physically accessible independent of the package contacts.

In this embodiment, the surfaces of terminals 241 and 245 are directly exposed, however, in alternative embodiments the terminals 241 and 245 may be coated with another material that is suitably electrically conductive. Such a material may protect the terminals 241 and 245 from contaminants during package and other processes. In one embodiment, the process for applying the adhesive layer 260 may include applying the adhesive layer 260 to the terminals of the redistribution regions.

In another embodiment, a metal-fill may be deposited on the exposed terminals up in the gap formed by the openings 251 of the dielectric layer 250. A predetermined amount of the metal-fill may be deposited, or metal-fill may be deposited up to a certain level below or above the top surface of the dielectric layer 250. In one embodiment the top surface of the metal-fill is approximately flush with the top surface of the dielectric layer 250.

Figure 10:
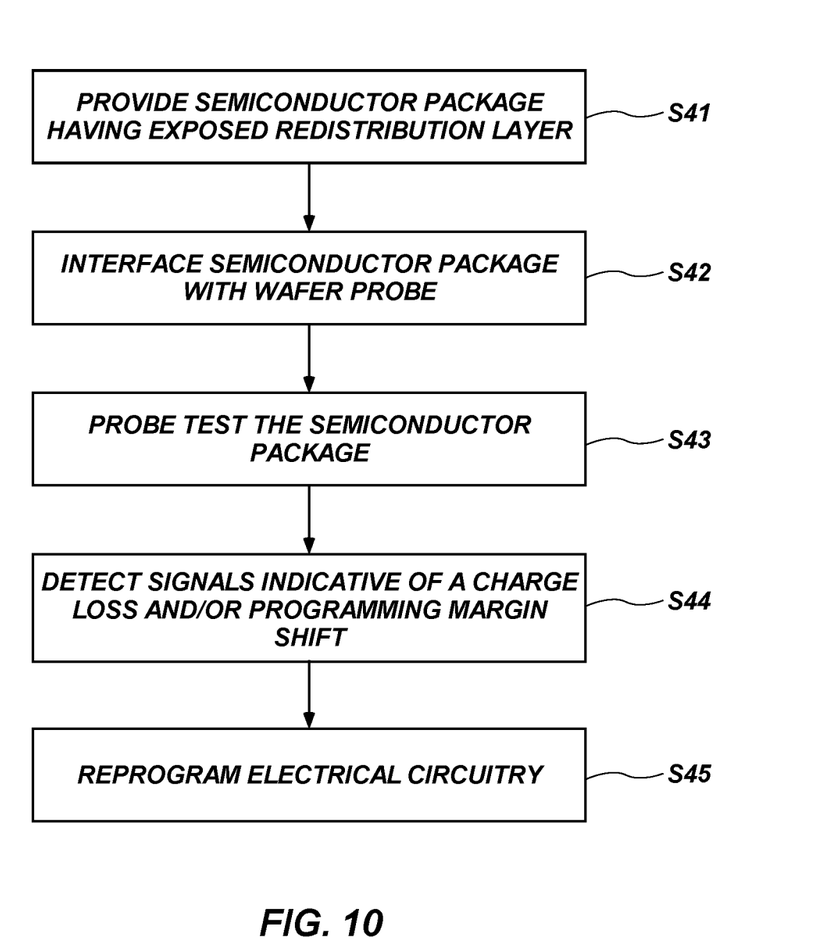
FIG. 10 is a flow chart of acts in a process for testing a semiconductor package that has exposed portions of a redistribution layer according to an embodiment of the disclosure.

FIG. 10 illustrates a test process of a semiconductor package such as semiconductor package 100 and semiconductor package 200 or a partially assembled variation, according to an exemplary embodiment of the disclosure.

A semiconductor package having an exposed redistribution layer is provided in operation S41. In this embodiment the semiconductor package is a partial package such as the partial package shown in FIGS. 4D, 5D, 8C and 9C, but it may also be a fully assembled semiconductor package. Preferably, the phase of package that is test may coincide with completing all high temperature process steps. The reference numbers of the partial package shown in FIGS. 4D and 5D will be used for simplicity of description.

A wafer prober (not shown) is interfaced with the semiconductor package in operation S42. A wafer prober needle may be positioned to be in electro conductive contact with one or more of the exposed terminals 141 and 145 of the semiconductor package.

Electrical testing of the semiconductor package is performed by the wafer prober in operation S43. Electrical testing may include testing the underlying electrical circuitry of the semiconductor device by generating test voltages at one or more of the exposed terminals 141 and 144 and reading voltages at one or more of the terminals 141 and 144.

Charge loss and/or programming margin shift (or lack there-of) from specification is detected in operation S44. If program margin shift is detected, the underlying circuit may be reprogrammed in operation S45.

While various embodiments of the disclosure have been described in terms of a certain layers, the scope of this disclosure should not be so limited. It is specifically contemplated that additional layers may be included in the package packages. By way of non-limiting example, adhesion layers may be included between a redistribution layer and dielectric layers to couple the metal of the redistribution layer to the polymer of the dielectric layers.

Further, it is specifically contemplated that more than one redistribution layer may be formed in the packaging process. For example, redistribution layers may be added to facilitate electrical conduction through the package for ground planes and power-planes. Such redistribution layers may or may not include exposed terminals such as with redistribution layer 140.

Finally, while various embodiments of the disclosure are described in terms of layers having a "thickness," and the accompanying drawings may appear to show a consistent thickness, it is specifically contemplated the thickness of a layer may vary, by way of non-limiting example, to accommodate desired characteristics of the final package. For example, signal characteristics, heat, structural strength, and the like. Further, thickness may vary simply by virtue of imperfections in the application process.

Although each operation illustrated by or in connection with FIGS. 1 through 9 and accompanying text recites acts performed in a particular order, embodiments of the present disclosure do not necessarily need to operate in that recited order. One of ordinary skill in the art would recognize many variations, including performing acts in parallel, or in a different order.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

I claim:

1. A method of packaging a semiconductor device having at least one testing bond pad and at least one functional bond pad on an active surface of the semiconductor device, wherein the at least one testing bond pad to enable testing the semiconductor device and the at least one functional bond pad to, among other functions, enable reprogramming of circuitry of the semiconductor device, the method comprising:
    forming a first redistribution material electrically coupled to the at least one functional bond pad;
    forming a second redistribution material electrically coupled to the at least one testing bond pad;
    forming a dielectric material on a side of the first and second redistribution materials opposite the respective at least one functional bond pad and the at least one testing bond pad;
    removing a first portion of the dielectric material to expose a first portion of the first redistribution material;
    removing a second portion of the dielectric material to expose a second portion of the first redistribution material; and
    removing a third portion of the dielectric material to expose a first portion of the second redistribution material.

2. The method of claim 1, further comprising forming an adhesive material on the second portion of the first redistribution material.

3. The method of claim 2, wherein the adhesive material is a solderable adhesive.

4. The method of claim 3, further comprising providing a package contact on the adhesive material.

5. The method of claim 4, wherein the first portion of the first redistribution material is still exposed after providing the package contact.

6. The method of claim 1, further comprising providing a package contact on the second portion of the first redistribution material.

7. An apparatus, comprising:
    electrically and physically accessible terminals of a semiconductor package for a semiconductor device, the terminals including at least one testing terminal and at least one functional terminal, wherein the at least one testing terminal electrically coupled to a testing bond pad of the semiconductor device via a redistribution material and the at least one functional terminal electrically coupled to a functional bond pad of the semiconductor device via a further redistribution material, the testing bond pad and the functional bond pad located on an active surface of the semiconductor device, wherein the at least one testing bond pad to enable testing electrical circuitry of the semiconductor device and the at least one functional bond pad to enable functions including reprogramming electrical circuitry of the semiconductor device; and at least one contact at a surface of the semiconductor package and electrically coupled to the at least one functional terminal.

8. The apparatus of claim 7, comprising a dielectric material on, and at least partially covering, the redistribution material, wherein the at least one testing terminal is exposed by an opening defined in the dielectric material.

9. A method, comprising:

providing a semiconductor package for a semiconductor device having at least one testing bond pad and at least one functional bond pad on an active surface of the semiconductor device, the at least one testing bond pad to enable testing electrical circuitry of the semiconductor device and the at least one functional bond pad to enable functions of the electrical circuitry, placing at least one probe needle in electrical and physical contact with at least one terminal of the semiconductor package, the at least one terminal of the semiconductor package to electrically couple with the at least one testing bond pad of the semiconductor device;

providing one or more test electrical signals from the at least one probe needle to the semiconductor package through the at least one terminal; and detecting signals indicative of a charge loss or programming margin shift via the at least one terminal of the semiconductor package.

10. The method of claim 9, further comprising reprogramming electrical circuitry of the semiconductor device responsive to the detected signals.

11. The method of claim 10, wherein reprogramming electrical circuitry of the semiconductor package device comprises reprogramming electrical circuitry of the semiconductor device via at least one further terminal, the at least one further terminal to electrically couple with the functional bond pad of the semiconductor device.

12. The method of claim 11, wherein the at least one functional terminal is accessible via a location on the semiconductor package that is remote from a location on the semiconductor package at which the at least one testing terminal is accessible.

13. The method of claim 9, wherein the semiconductor package is a wafer-level-chip-scale-package.

14. A method, comprising:

providing a semiconductor package for a semiconductor device having at least one testing bond pad and at least one functional bond pad on an active surface of the semiconductor device, the at least one testing bond pad to enable testing electrical circuitry of the semiconductor device and the at least one functional bond pad to enable functions including reprogramming electrical circuitry of the semiconductor device;

providing one or more test signals to a first portion of an exposed first redistribution material electrically coupled to the at least one testing bond pad of the semiconductor device;

detecting signals indicative of a charge loss or programming margin shift; and reprogramming circuitry of the semiconductor device responsive to the detected signals by providing reprogramming signals to an exposed second redistribution material electrically coupled to the at least one functional bond pad of the semiconductor device.

\* \* \* \* \*

UNITED STATES PATENT AND TRADEMARK OFFICE
CERTIFICATE OF CORRECTION

PATENT NO. : 11,600,523 B2
APPLICATION NO. : 15/940807
DATED : March 7, 2023
INVENTOR(S) : ManKit Lam Page 1 of 1

It is certified that error appears in the above-identified patent and that said Letters Patent is hereby corrected as shown below:

In the Claims

Claim 11, Column 14, Line 2, change "semiconductor package device" to --semiconductor device--

Signed and Sealed this
Twenty-seventh Day of February, 2024

Katherine Kelly Vidal
*Director of the United States Patent and Trademark Office*